United States Patent
Leung

(10) Patent No.: US 9,423,451 B2
(45) Date of Patent: Aug. 23, 2016

(54) METHOD AND APPARATUS FOR TESTING A SEMICONDUCTOR PACKAGE HAVING A PACKAGE ON PACKAGE (POP) DESIGN

(71) Applicant: Marvell World Trade Ltd., St. Michael (BB)

(72) Inventor: Yat Fai Leung, Granite Bay, CA (US)

(73) Assignee: Marvell World Trade Ltd., St. Michael (BB)

( * ) Notice: Subject to any disclaimer, the term of this patent is extended or adjusted under 35 U.S.C. 154(b) by 120 days.

(21) Appl. No.: 14/284,241

(22) Filed: May 21, 2014

(65) Prior Publication Data

US 2014/0354324 A1 Dec. 4, 2014

Related U.S. Application Data

(60) Provisional application No. 61/830,771, filed on Jun. 4, 2013.

(51) Int. Cl.
*G01R 31/26* (2014.01)
*G01R 31/28* (2006.01)
*H01L 21/66* (2006.01)

(52) U.S. Cl.
CPC ............ *G01R 31/2889* (2013.01); *H01L 22/14* (2013.01); *G01R 31/2863* (2013.01); *G01R 31/2896* (2013.01)

(58) Field of Classification Search
CPC ........... G01R 31/2889; G01R 31/2863; G01R 31/2896; H01L 22/14
USPC .................................................... 324/762.01
See application file for complete search history.

(56) References Cited

U.S. PATENT DOCUMENTS

| 5,739,050 | A | 4/1998 | Farnworth | |
|---|---|---|---|---|
| 8,405,414 | B2 * | 3/2013 | Durbin | G01R 1/07378 324/754.11 |
| 2004/0088855 | A1 * | 5/2004 | Akram | G01R 1/07314 29/840 |
| 2007/0018300 | A1 | 1/2007 | Ryu et al. | |
| 2011/0089552 | A1 | 4/2011 | Park et al. | |
| 2014/0264812 | A1 * | 9/2014 | Chang | H01L 25/0657 257/686 |
| 2014/0266281 | A1 * | 9/2014 | Wang | G01R 1/0483 324/756.02 |

OTHER PUBLICATIONS

PCT Search Report and Written Opinion mailed Sep. 30, 2014 for PCT Application No. PCT/US14/39084, 11 Pages.

* cited by examiner

*Primary Examiner* — Melissa Koval
*Assistant Examiner* — Rahul Maini

(57) ABSTRACT

Embodiments include a testing arrangement for testing a first package, the testing arrangement comprising a frame having a top section and a bottom section, wherein the bottom section of the frame comprises a pickup section, and wherein the pickup section has a first air pathway; a second package mounted on a top surface of the bottom section of the frame such that a second air pathway is defined between (i) the second package and (ii) the top surface of the bottom section of the frame; and a vacuum path defined by (i) the first air pathway and (ii) the second air pathway, wherein during testing of the first package, a vacuum in the vacuum path is generated such that the pickup section of the bottom section of the frame holds the first package.

20 Claims, 3 Drawing Sheets

US 9,423,451 B2

METHOD AND APPARATUS FOR TESTING A SEMICONDUCTOR PACKAGE HAVING A PACKAGE ON PACKAGE (POP) DESIGN

CROSS REFERENCE TO RELATED APPLICATIONS

The present disclosure claims priority to U.S. Provisional Patent Application No. 61/830,771, filed on Jun. 4, 2013, which is incorporated herein by reference in its entirety.

TECHNICAL FIELD

Embodiments of the present disclosure relate to testing a semiconductor package, and in particular to method and apparatus for testing a semiconductor package having a package on package (PoP) design.

BACKGROUND

In electronics manufacturing, integrated circuit packaging is the final stage of semiconductor device fabrication, in which semiconducting material is encased in a supporting case that prevents physical damage and corrosion to the semiconducting material. The case, also known as a "package", supports the electrical contacts which connect the semiconductor device, for example, to a circuit board. There are many different types of packages to encapsulate a semiconductor device, including a package on package (PoP) semiconductor device. A package on package (PoP) semiconductor device comprises two or more semiconductor packages, e.g., a first semiconductor package and a second semiconductor package. It may be desirable to separately test the first semiconductor package of the PoP, e.g., prior to the first semiconductor package being packaged within the PoP.

While separately testing the first semiconductor package, the first semiconductor package needs to communicate with a third semiconductor package that mimics or emulates a behavior of the second semiconductor package (e.g., such that the first semiconductor package functions in a manner that is similar to the manner in which the first semiconductor package will function while integrated in the PoP). Thus, a testing arrangement to test the first semiconductor package may include the third semiconductor package, to mimic or emulate the behavior of the second semiconductor package.

SUMMARY

In various embodiments, the present disclosure provides a testing arrangement for testing a first package, the testing arrangement comprising a frame having a top section and a bottom section, wherein the bottom section of the frame comprises a pickup section, and wherein the pickup section has a first air pathway; a second package mounted on a top surface of the bottom section of the frame such that a second air pathway is defined between (i) the second package and (ii) the top surface of the bottom section of the frame; and a vacuum path defined by (i) the first air pathway and (ii) the second air pathway, wherein during testing of the first package, a vacuum in the vacuum path is generated such that the pickup section of the bottom section of the frame holds the first package.

In various embodiments, the present disclosure provides a method for operating a testing arrangement for testing a first package, the testing arrangement comprising a frame having a top section and a bottom section, wherein the bottom section of the frame comprises a pickup section, and wherein the method comprises: placing the first package proximal to the pickup section of the bottom section of the frame, wherein the pickup section of the bottom section of the frame has a first air pathway, and wherein a second package is mounted on a top surface of the bottom section of the frame such that a second air pathway is defined between (i) the second package and (ii) the top surface of the bottom section of the frame; generating a vacuum in a vacuum path defined by (i) the first air pathway within the pickup section included in the bottom section of the frame and (ii) the second air pathway defined between the second package and the top surface of the bottom section of the frame; based on generating the vacuum in the vacuum path, suctioning, by the pickup section of the bottom section of the frame, the first package, such that the pickup section of the bottom section of the frame holds the first package; and while the pickup section of the bottom section of the frame holds the first package, testing, by the testing arrangement, the first package.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Various embodiments are illustrated by way of example and not by way of limitation in the figures of the accompanying drawings.

DETAILED DESCRIPTION

Figure 1:
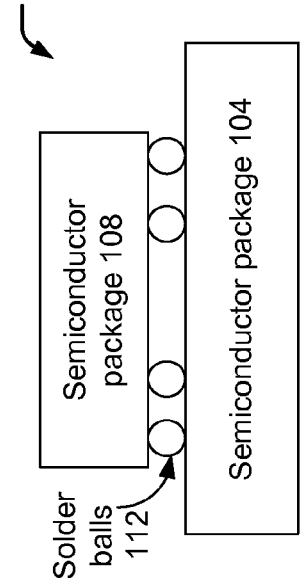
FIG. 1 schematically illustrates a package on package (POP) comprising two semiconductor packages.

FIG. 1 schematically illustrates a package on package (POP) 100 comprising semiconductor packages 104 and 108. The semiconductor packages 104 and 108 are coupled via, for example, solder balls 112.

The semiconductor packages 104 and 108 can be any appropriate types of semiconductor packages. Merely as an example, the semiconductor package (henceforth referred to as "package") 108 comprises a memory die, and the package 104 comprises a system on a chip (SoC), where the SoC comprises one or more processors and/or a memory controller to control a memory included in the memory die of the package 108.

During manufacturing (or during any other time), it may be intended to test the packages 104 and/or 108, e.g., to verify proper functionality. In an example, the packages 104 and/or 108 are tested subsequent to forming the PoP 100. However, there may be situations when it is desirable to test one or both of the packages 104 and 108, prior to the formation of the PoP 100 (e.g., while the packages 104 and 108 are not coupled to form the PoP 100). Merely as an example, a first manufacturer manufactures the package 104, while a second manufacturer manufactures the package 108. In such an example, the first manufacturer may intend to test the package 104, e.g., prior to the package 104 being coupled to the package 108 to form the PoP 100.

Figure 2:
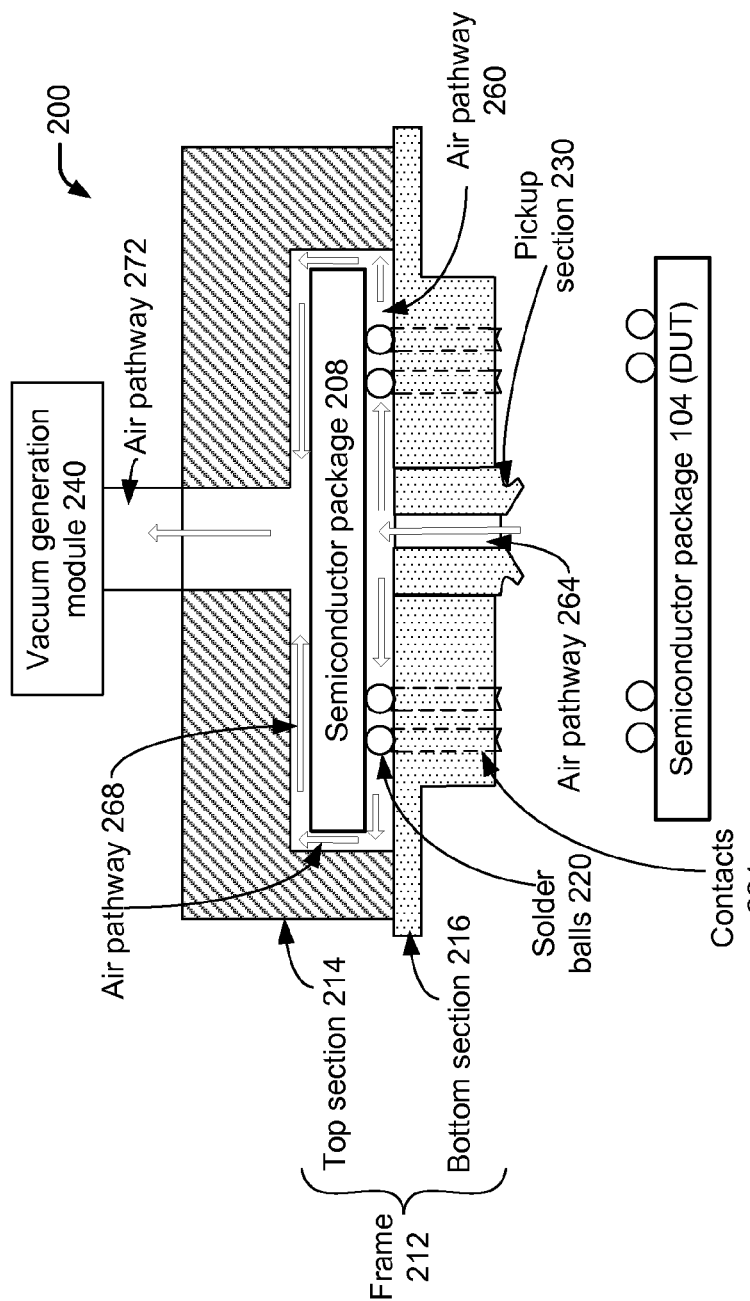
FIG. 2 schematically illustrates a testing arrangement to test a semiconductor package.

FIG. 2 schematically illustrates a testing arrangement 200 (henceforth referred to as an "arrangement") to test the package 104 of FIG. 1 (e.g., prior to the package 104 being packaged within the PoP 100). Thus, the package 104 forms a device under test (DUT) in FIG. 2. FIG. 2 illustrates a cross sectional view of the arrangement 200. In the embodiment of FIG. 2, the package 104 is not being tested—so, the package 104 is illustrated to be separate from the testing arrangement 200.

In an example, to properly test the functionality of the package 104, the package 104 needs to communicate with the package 108. However, the arrangement 200 tests the package 104, prior to the package 104 being coupled to the package 108 to form the PoP 100. Accordingly, the arrangement 200 comprises a package 208 that mimics or emulates the package 108. For example, during testing the package 104, the package 104 communicates with the package 208, e.g., while the package 208 mimics or emulates a functionality of the package 108, thereby enabling the arrangement 200 to test the package 104.

The arrangement 200 comprises a frame 212. In an embodiment, the frame 212 comprises a top section 214 (illustrated using diagonal lines in FIG. 2) and a bottom section 216 (illustrated using dots in FIG. 2). In an embodiment, the top section 214 and the bottom section 216 defines a cavity within the frame 212, and the package 208 is mounted or embedded within the cavity defined by the top section 214 and the bottom section 216. For example, the package 208 is mounted on a top surface of the bottom section 216 of the frame 212 using, for example, a plurality of solder balls 220.

As also illustrated in FIG. 2, a space, air pathway or air channel 260 (henceforth referred to as "air pathway 260") is defined between a bottom surface of the package 208 and the top surface of the bottom section 216 of the frame 212. A height of the air pathway 260 between the package 208 and the bottom section 216 is based on, for example, a height of the solder balls 220. For example, the air pathway 260 between the package 208 and the bottom section 216 is defined in part by space between the solder balls 220. Additionally or alternatively, the air pathway 260 between the package 208 and the bottom section 216 extends to a space between the package 208 and the bottom section 216, which is outside of a periphery of the solder balls 220.

Figure 3:
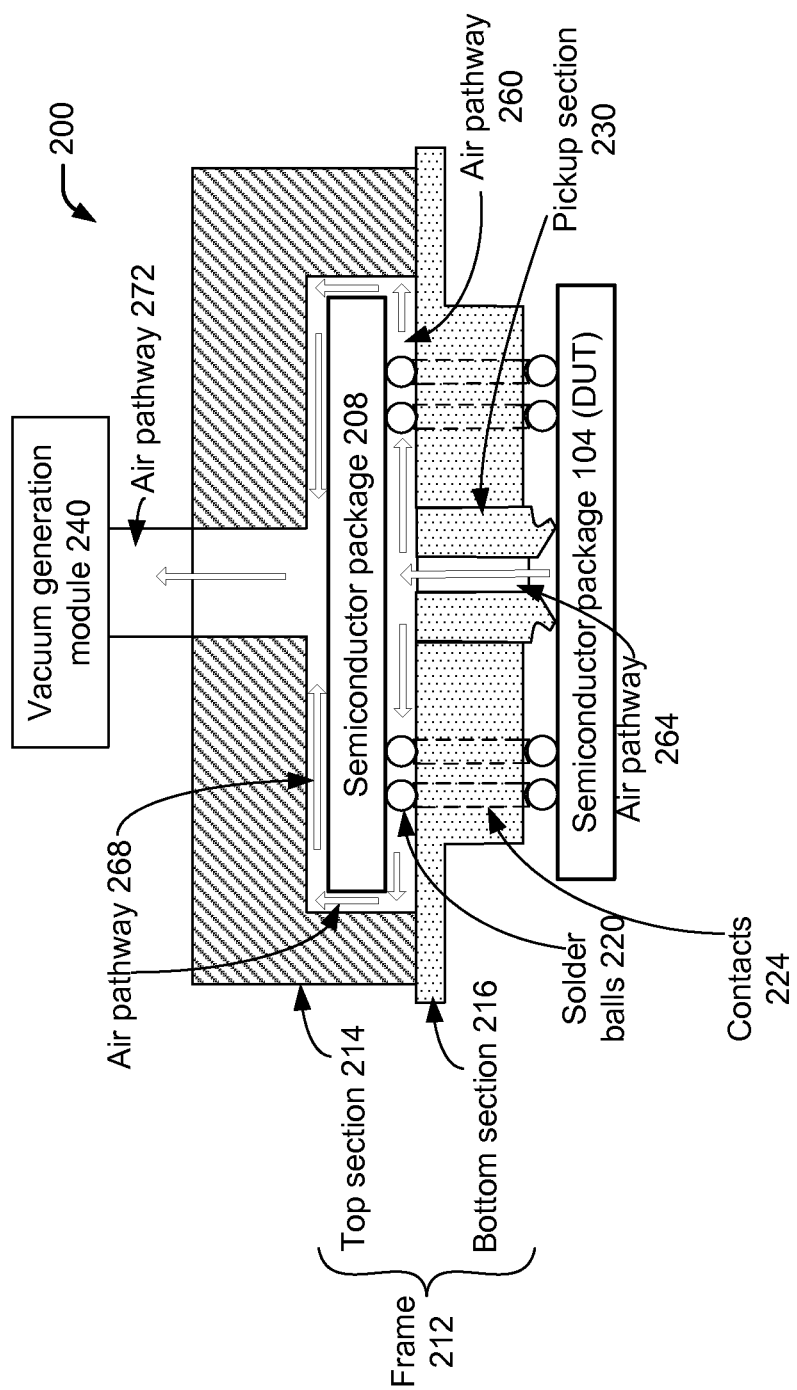
FIG. 3 schematically illustrates the testing arrangement of FIG. 2, while the testing arrangement holds the semiconductor package for testing.

The arrangement 200 comprises a plurality of contacts 224 configured to electrically couple the packages 104 and 208, while the package 104 is being tested (although FIG. 2 does not illustrate the contacts 224 making contact with the package 104). The contacts 224 are spring loaded pins or pressure activated pins. For example, the contacts 224 are Pogo® pins. When pressure is applied to the contacts 224, the contacts 224 make electrical contact. In an embodiment, each of the contacts 224 has a corresponding first end (e.g., a top end in FIG. 2) coupled to a corresponding one of the solder balls 220. Also, each of the contacts 224 has a corresponding section (e.g., a middle section, illustrated using dotted line in FIG. 2) embedded within the bottom section 216 of the frame 212. Also, each of the contacts 224 has a corresponding second end (e.g., a bottom end in FIG. 2) that is exposed through a bottom surface of the bottom section 216 of the frame 212. During testing of the package 104, the contacts 224 makes contact with the package 104 (e.g., as illustrated in FIG. 3).

In an embodiment, the bottom section 216 of the frame 212 comprises a pickup section 230. The pickup section 230 has a cavity, space, air channel or air pathway 264 (henceforth referred to as "air pathway 264") built within. An end (e.g., a bottom end) of the air pathway 264 is exposed outside the frame 212.

In an embodiment, a cavity, space, air channel or air pathway 268 (henceforth referred to as "air pathway 268") is also defined between (i) a side and top surface of the package 208, and (ii) the top section 214 of the frame 212, as illustrated in FIG. 2. In an embodiment, a cavity, space, air channel or air pathway 272 (henceforth referred to as "air pathway 272") is also defined is the top section 214 of the frame 212. The air pathway 272 opens up to a top surface of the top section 214 of the frame 212.

The air pathways 260, 264, 268 and 272 are interconnected, as illustrated in FIG. 2. The package 208 is embedded within the frame 214, such that airway paths are defined along the periphery or external surfaces of the package 208. In an embodiment, an upper end of the airway path 272 is coupled to a vacuum generation module 240. The vacuum generation module 240 can suck air through the air pathways 260, 264, 268 and 272, thereby generating a vacuum at a lower end of the pickup section 230 (i.e., the end that is exposed outside of the frame 212). The vacuum generation module 240 comprises, for example, a vacuum pump.

Although not illustrated in FIG. 2, the arrangement 200 comprises several other components. For example, although the arrangement 200 comprises circuitry (e.g., apart from the package 208) to test the package 104, such circuitry is not illustrated in FIG. 2. In an embodiment and although not illustrated in FIG. 2, the arrangement comprises a boundary or periphery wall below the bottom section 216 of the frame 212. Such a wall is, for example, used to hold the package 104 in place during testing of the package 104 (and while the package 104 is being held by pickup section 230 by vacuum created by the vacuum generation component 240, as illustrated in FIG. 3).

FIG. 3 schematically illustrates the arrangement 200 of FIG. 2, while the arrangement 200 holds the package 104 for testing. In an embodiment, during testing of the package 104, the package 104 is placed below the pickup section 230, and the vacuum generation module 240 sucks air from the air pathways 272, 268, 260 and 264. The sucking of air from the air pathways create a near vacuum (e.g., a low air pressure) below the pickup section 230, as a result of which the package 104 is suctioned and placed in position by the pickup section 230, as illustrated in FIG. 3.

In an embodiment, the pickup section 230 (or at least a section of the pickup section 230) comprises flexible material (e.g., rubber, polymer, etc.). For example, at least a bottom surface of the pickup section 230 comprises flexible material, which creates a vacuum seal at the surface of the package 104. Also, while the pickup section 230 picks up the package 104, the pickup section may be slightly compressed, to create a better vacuum seal. To generate the compression of the pickup section 230, the pickup section 230 comprises flexible material (or has springs included in the pickup section 230).

In an embodiment, while the arrangement 200 holds the package 104 for testing (i.e., while the pickup section 230 suctions the package 104), each of the contacts 224 has a corresponding end (e.g., a bottom end in FIG. 3) coupled to a corresponding one of the solder balls of the package 104, as illustrated in FIG. 3. Thus, individual ones of the contacts 224 electrically couples a corresponding solder ball of the package 104 with a corresponding solder ball of the package 208.

During testing of the package 104, the package 104 communicates with the package 208. As previously discussed, during testing of the package 104, the package 208 mimics or emulates a functionality of the package 108 of FIG. 1. Thus, during testing of the package 104, from a perspective of the package 104, the package 104 is communicating with a top package of the PoP 100 of FIG. 1. Also, embedding the package 208 within the frame, as illustrated in FIGS. 2 and 3, results in the package 208 being positioned proximally to the package 104. Thus, the testing environment of the arrangement 200 (i.e., the package 208 being positioned proximally to the package 104) is very similar to the environment of the PoP 100 (e.g., in which the package 108 is positioned proximally to the package 104). For example, a distance between the packages 104 and 208 (e.g., during testing of the package 104) is almost about the same as a distance between the packages 104 and 108 in the PoP 100, thereby making the testing conditions of the package 104 more realistic (and having better integrity of the signals transmitted between the packages 104 and 208, during testing of the package 104).

Figure 4:
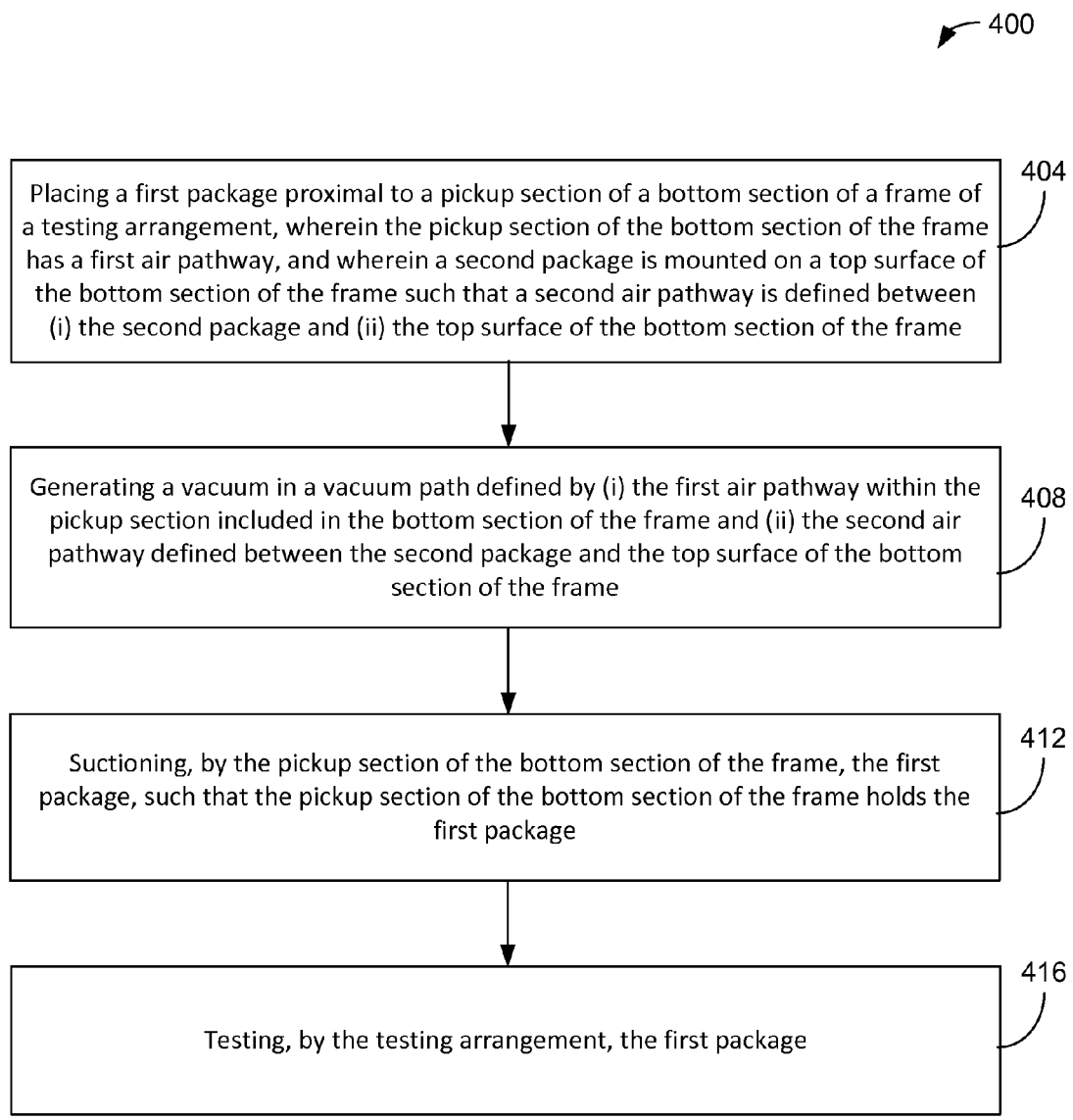
FIG. 4 is a flow diagram of a method to operate a testing arrangement.

FIG. 4 is a flow diagram of a method 400 to operate a testing arrangement (e.g., the testing arrangement 200 of FIGS. 2 and 3). At 404, a first package (e.g., package 104) is placed proximal to a pickup section (e.g., pickup section 230) of a bottom section (e.g., bottom section 216) of a frame (frame 212) of the testing arrangement. In an embodiment, the pickup section of the bottom section of the frame has a first air pathway (e.g., air pathway 264), and a second package (e.g., package 208) is mounted on a top surface of the bottom section of the frame such that a second air pathway is defined between (i) the second package and (ii) the top surface of the bottom section of the frame.

At 408, a vacuum is generated in a vacuum path defined by (i) the first air pathway within the pickup section included in the bottom section of the frame and (ii) the second air pathway defined between the second package and the top surface of the bottom section of the frame.

At 412, the pickup section of the bottom section of the frame suctions the first package, such that the pickup section of the bottom section of the frame holds the first package. At 416, while the pickup section of the bottom section of the frame holds the first package, the testing arrangement tests the first package.

The description may use the phrases "in an embodiment," or "in embodiments," which may each refer to one or more of the same or different embodiments. The phrase "in some embodiments" is used repeatedly. The phrase generally does not refer to the same embodiments; however, it may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B." The phrase "at least one of A, B and C" means (A), (B), (C), (A and B), (A and C), (B and C) or (A, B and C). The phrase "(A) B" means (B) or (A and B), that is, A is optional.

Although certain embodiments have been illustrated and described herein, a wide variety of alternate and/or equivalent embodiments or implementations calculated to achieve the same purposes may be substituted for the embodiments illustrated and described without departing from the scope of the present invention. This application is intended to cover any adaptations or variations of the embodiments discussed herein. Therefore, it is manifestly intended that embodiments in accordance with the present invention be limited only by the claims and the equivalents thereof.

What is claimed is:

1. A testing arrangement for testing a first package, the testing arrangement comprising:
a frame having a top section and a bottom section, wherein the bottom section of the frame comprises a pickup section, and wherein the pickup section has a first air pathway;
a second package mounted on a top surface of the bottom section of the frame such that
(A) a second air pathway is defined between (i) the second package and (ii) the top surface of the bottom section of the frame, and
(B) a third air pathway is defined between (i) a side surface and a top surface of the second package and (ii) the top section of the frame; and
a vacuum path defined by (i) the first air pathway, (ii) the second air pathway, and (iii) the third air pathway,
wherein the first air pathway, the second air pathway, and the third air pathway are interconnected, and
wherein during testing of the first package, a vacuum in the vacuum path is generated such that the pickup section of the bottom section of the frame holds the first package.

2. The testing arrangement of claim 1,
wherein the second package includes a semiconductor die.

3. The testing arrangement of claim 1, wherein:
the second package is mounted on the top surface of the bottom section of the frame using a plurality of solder balls, wherein the second air pathway comprises space between the plurality of solder balls.

4. The testing arrangement of claim 1, further comprising:
a plurality of connectors, wherein each connector of the plurality of connectors has a corresponding first end coupled to the second package, and wherein each connector of the plurality of connectors has a corresponding section embedded within the bottom section of the frame.

5. The testing arrangement of claim 4, wherein:
the second package is mounted on the top surface of the bottom section of the frame using a plurality of solder balls; and
each connector of the plurality of connectors has the corresponding first end coupled to a corresponding solder ball of the plurality of solder balls of the second package.

6. The testing arrangement of claim 4, wherein:
during testing of the first package and while the pickup section holds the first package, each connector of the plurality of connectors has a corresponding second end coupled to the first package.

7. The testing arrangement of claim 1, wherein:
the first package is configured to be, subsequent to testing the first package, packaged in a package on package (PoP);
the PoP comprises a third package coupled to the first package; and
during testing of the first package, the second package is configured to emulate a functionality of the third package.

8. The testing arrangement of claim 7, wherein:
the third package is a memory chip; and
the first package is a system on a chip (SoC) comprising a memory controller configured to control a memory included in the memory chip.

9. The testing arrangement of claim 1, further comprising:
a vacuum generation module configured to generate the vacuum in the vacuum path.

10. The testing arrangement of claim 1, wherein:
the top section of the frame and the bottom section of the frame defines a cavity within the top section of the frame and the bottom section of the frame; and
the second package is embedded within the cavity defined by the top section of the frame and the bottom section of the frame.

11. A method for operating a testing arrangement for testing a first package, the testing arrangement comprising a frame having a top section and a bottom section, wherein the bottom section of the frame comprises a pickup section, and wherein the method comprises:

placing the first package proximal to the pickup section of the bottom section of the frame, wherein the pickup section of the bottom section of the frame has a first air pathway, and wherein a second package is mounted on a top surface of the bottom section of the frame such that
(A) a second air pathway is defined between (i) the second package and (ii) the top surface of the bottom section of the frame, and
(B) a third air pathway is defined between (i) a side surface and a top surface of the second package and (ii) the top section of the frame;

generating a vacuum in a vacuum path defined by (i) the first air pathway, (ii) the second air pathway, and (iii) the third air pathway, wherein the first air pathway, the second air pathway, and the third air pathway are interconnected;

based on generating the vacuum in the vacuum path, suctioning, by the pickup section of the bottom section of the frame, the first package, such that the pickup section of the bottom section of the frame holds the first package; and while the pickup section of the bottom section of the frame holds the first package, testing, by the testing arrangement, the first package.

12. The method of claim 11, wherein the second package includes a semiconductor die.

13. The method of claim 11, wherein:
the second package is mounted on the top surface of the bottom section of the frame using a plurality of solder balls; and
the second air pathway comprises space between the plurality of solder balls.

14. The method of claim 11, wherein:
the testing arrangement further comprises a plurality of connectors;
each connector of the plurality of connectors has a corresponding first end coupled to the second package; and
each connector of the plurality of connectors has a corresponding section embedded within the bottom section of the frame.

15. The method of claim 14, wherein:
the second package is mounted on the top surface of the bottom section of the frame using a plurality of solder balls; and
each connector of the plurality of connectors has the corresponding first end coupled to a corresponding solder ball of the plurality of solder balls of the second package.

16. The method of claim 14, further comprising:
during testing of the first package and while the pickup section holds the first package, coupling a corresponding second end of each connector of the plurality of connectors to the first package.

17. The method of claim 11, further comprising:
subsequent to testing the first package, packaging the first package in a package on package (PoP), wherein the PoP comprises a third package coupled to the first package; and
during testing of the first package, emulating, by the second package, a functionality of the third package.

18. The method of claim 17, wherein:
the third package is a memory chip; and
the first package is a system on a chip (SoC) comprising a memory controller configured to control a memory included in the memory chip.

19. The method of claim 11, wherein generating the vacuum further comprises:
generating the vacuum using a vacuum generation module included in the testing arrangement.

20. The method of claim 11, wherein:
the top section of the frame and the bottom section of the frame defines a cavity within the top section of the frame and the bottom section of the frame; and
the second package is embedded within the cavity defined by the top section of the frame and the bottom section of the frame.

* * * * *